(12) United States Patent
Liang

(10) Patent No.: US 8,929,962 B2
(45) Date of Patent: Jan. 6, 2015

(54) SUPER-CONDUCTIVE TUBE USED FOR A DISCHARGE DEVICE

(76) Inventor: Chao-Yuan Liang, Taipei (TW)

(*) Notice: Subject to any disclaimer, the term of this patent is extended or adjusted under 35 U.S.C. 154(b) by 246 days.

(21) Appl. No.: 13/355,971

(22) Filed: Jan. 23, 2012

(65) Prior Publication Data

US 2013/0190182 A1   Jul. 25, 2013

(51) Int. Cl.
| | |
|---|---|
| H01L 39/00 | (2006.01) |
| H01L 39/08 | (2006.01) |
| H01B 12/00 | (2006.01) |
| B82Y 99/00 | (2011.01) |
| H01L 39/12 | (2006.01) |

(52) U.S. Cl.
CPC ............... *H01L 39/08* (2013.01); *H01B 12/00* (2013.01); *B82Y 99/00* (2013.01); *H01L 39/12* (2013.01)
USPC ........................................................ 505/150

(58) Field of Classification Search
CPC ........ H01L 39/08; H01L 39/12; B82Y 99/00; H01B 12/00
USPC ........................................................ 505/150
See application file for complete search history.

(56) References Cited

U.S. PATENT DOCUMENTS

| 3,571,922 | A | * | 3/1971 | Schweitzer et al. | ............ 29/599 |
| 5,327,015 | A | * | 7/1994 | Hackett | ......................... 502/211 |
| 6,514,557 | B2 | * | 2/2003 | Finnemore et al. | ............. 427/62 |
| 7,521,708 | B1 | * | 4/2009 | Agassi | ............................. 257/31 |
| 2007/0295484 | A1 | * | 12/2007 | Tsai | ......................... 165/104.21 |

OTHER PUBLICATIONS

Malagoli et al. "Effect of grain refinement on enhancing critical current density and upper critical field in undoped MgB2 ex situ tapes." Journal of Applied Physics 104, 103908 2008 (pp. 1-7).*

* cited by examiner

*Primary Examiner* — Paul Wartalowicz
(74) *Attorney, Agent, or Firm* — Muncy, Geissler, Olds & Lowe, P.C.

(57) ABSTRACT

A super-conductive tube used for a discharge device is formed integrally by a super-conductive material. The super-conductive tube is a hollow tube formed by a front end surface, a rear end surface, an inner tube wall and an outer tube wall. An interior of the super-conductive tube is formed with a hollow space and an interior of the hollow space is in a vacuum state. The inner tube wall and the outer tube wall are formed by extending the front end surface toward the rear end surface and an end of the outer tube wall is extended with a guide portion toward the discharge device. Accordingly, when the super-conductive tube is applied to a discharge device, electrical energy will be generated by the super-conductive tube through a magnetic field that results from an operation of electric current, after the discharge device has released electric energy.

5 Claims, 3 Drawing Sheets

SUPER-CONDUCTIVE TUBE USED FOR A DISCHARGE DEVICE

BACKGROUND OF THE INVENTION a) Field of the Invention

The present invention relates to a super-conductive tube, and more particularly to a super-conductive tube on a discharge device.

b) Description of the Prior Art

The global resources drop continuously due to non-stop development of the earth resources. Especially, in a daily life, electrical energy needs to be utilized in a great amount.

In existing media to transmit the electrical energy, a magnetic coil is mostly used as a medium to transmit the electrical energy. However, energy will be lost in the process of transmitting the electrical energy.

The existing magnetic coil is mostly made by a metallic material, such as copper. As resistance will occur in the metallic material, when electric current flows through the metallic material, the electrical energy will be lost to convert into heat. Thus, too much loss of energy will be formed in the process of transmitting the electrical energy and most of the electrical energy will be wasted.

When the conventional magnetic coil is operating, the electric current will flow through the magnetic coil to convert into electrical energy and when the electric current passes through the magnetic coil, energy will be lost, reducing utilization of the electrical energy significantly. This method largely decreases efficiency of a discharge device and wastes more resources.

SUMMARY OF THE INVENTION

Accordingly, the primary object of the present invention is to provide a super-conductive tube that is used for a discharge device.

The aforementioned super-conductive tube is formed integrally by a super-conductive material. The super-conductive tube is a hollow tube formed by a front end surface, a rear end surface, an inner tube wall and an outer tube wall. An interior of the super-conductive tube is formed with a hollow space and an interior of the hollow space is in a vacuum state. The inner tube wall and the outer tube wall are formed by extending the front end surface toward the rear end surface and an end of the outer tube wall is extended with a guide portion toward the discharge device.

Accordingly, when the super-conductive tube is applied to a discharge device, electrical energy can be generated by the super-conductive tube through a magnetic field that results from an operation of the electric current, after the discharge device has released electrical energy.

In the present invention, the super-conductive material refers to ceramic, magnesium boride ($MgB_2$) or a double-wall Carbon nanotube with $MgB_2$.

To enable a further understanding of the said objectives and the technological methods of the invention herein, the brief description of the drawings below is followed by the detailed description of the preferred embodiments.

DETAILED DESCRIPTION OF THE PREFERRED EMBODIMENTS

Figure 1:
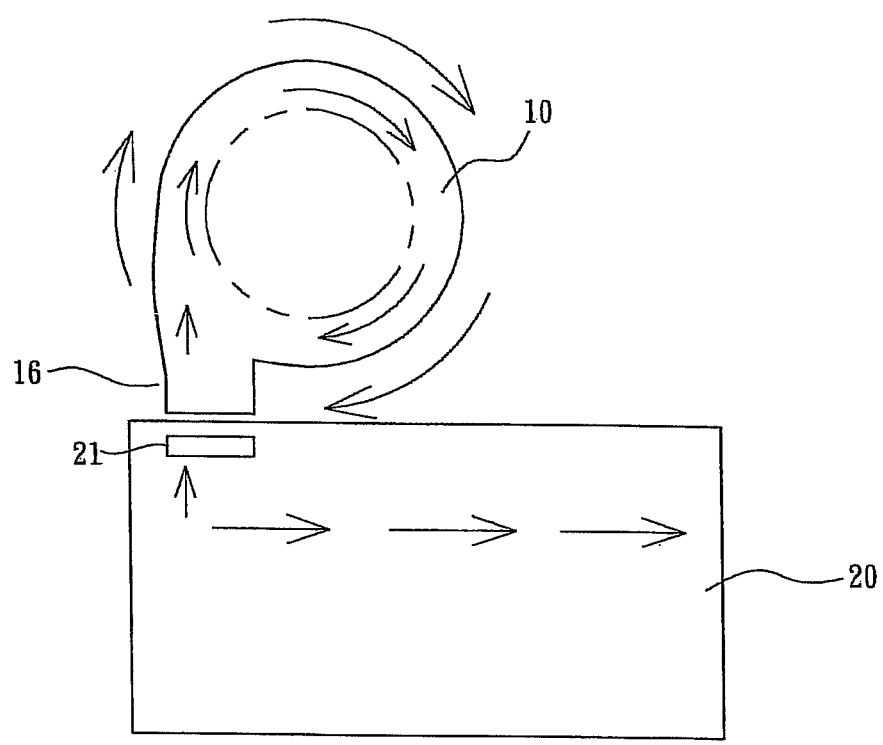
FIG. 1 shows a schematic view of a super-conductive tube of the present invention in a state of use.
Figure 2:
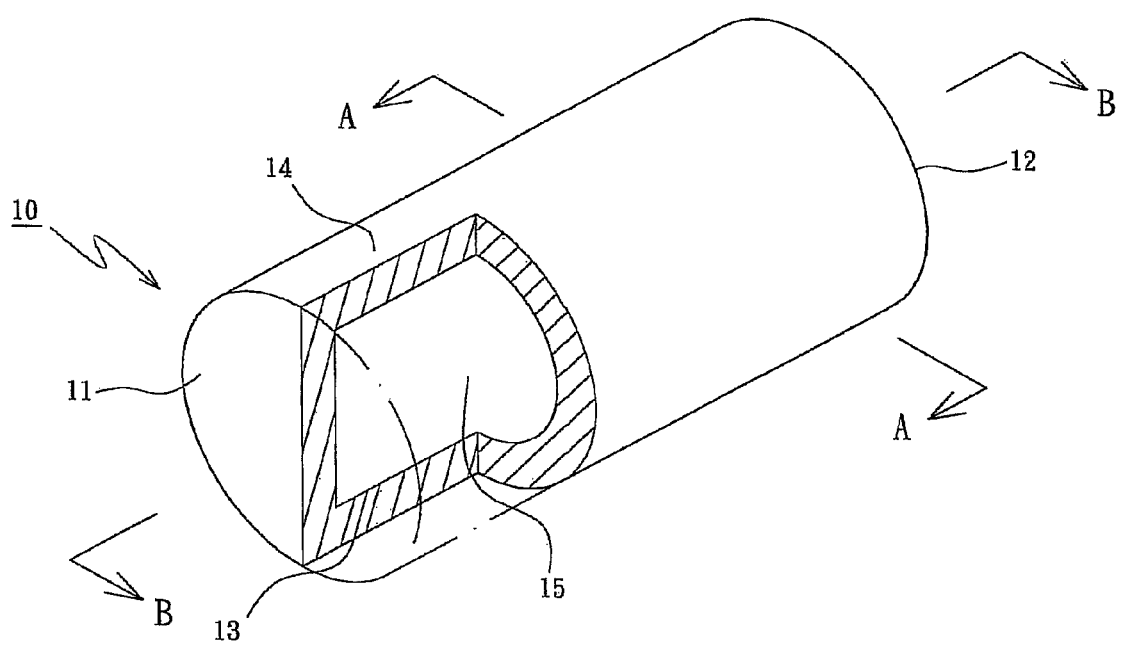
FIG. 2 shows a three-dimensional view of the super-conductive tube of the present invention.

Referring to FIG. 1 and FIG. 2, it shows a super-conductive tube 10 used for a discharge device, as disclosed by a first embodiment of the present invention. The super-conductive tube 10 is used on a discharge device 20 having a metallic coil 21, such as a power generator.

The super-conductive tube 10 is formed integrally by a super-conductive material and the super-conductive material can be ceramic, magnesium boride ($MgB_2$) or a double-wall Carbon nanotube with $MgB_2$. The super-conductive tube 10 is a hollow tube formed by a front end surface 11, a rear end surface 12, an inner tube wall 13 and an outer tube wall 14.

The inner tube wall 13 and the outer tube wall 14 are formed by extending the front end surface 11 toward the rear end surface 12, forming a hollow space 15 in an interior of the super-conductive tube 10. An interior of the hollow space 15 is in a vacuum state and a side of the outer tube wall 14 is extended with a guide portion 16 toward the discharge device 20.

Accordingly, when the super-conductive tube 10 of the present invention is used on the discharge device 20, the super-conductive tube 10 is put above the discharge device 20, allowing the guide portion 16 of the super-conductive tube 10 to be exactly above the discharge device 20. When the discharge device 20 operates to produce electric current, the electric current will flow along the direction as shown in the drawings, and the discharge device 20 (as this is an ordinary discharge device, no further description is required) will use the guide portion 16 to guide the electric current onto the super-conductive tube 10.

The electric current will flow around a rim of an inner ring of the inner tube wall 13 clockwise or counterclockwise and the flow direction is the same as that of the electric current on the discharge device 20. As the electric current is on the super-conductive tube 10 and uses the inner tube wall 13 of the super-conductive tube 10 to operate continuously clockwise or counterclockwise, an electromagnetic field will be formed around the super-conductive tube 10, thereby achieving an effect of generating power from the discharge device 20 that is provided with a metallic coil 21, through this electromagnetic field.

As the super-conductive tube 10 of the present invention is formed integrally by a super-conductive material and the super-conductive material is provided with zero resistance, when the electric current that is generated on the discharge device 20 passes through the super-conductive tube 10, the zero-resistance of the super-conductive tube 10 can be used to allow the electric current to flow continuously on the inner rim of the super-conductive tube 10, thereby achieving the effect of generating power from the discharge device 20 that is provided with the metallic coil 21, through the electromagnetic field. Thus, the requirement that the discharge device 20 needs to be driven continuously can be avoided effectively to reduce the energy loss effectively.

Figure 3:
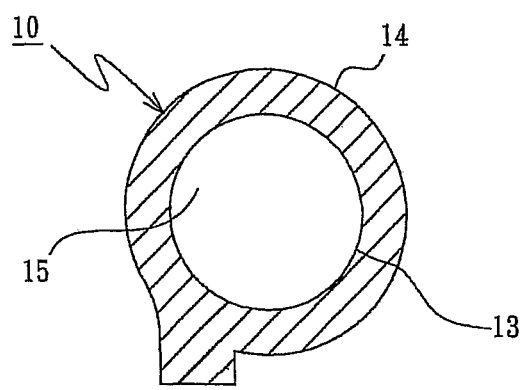
FIG. 3 shows a cut-away view of the super-conductive tube of the present invention, along the line A-A.
Figure 4:
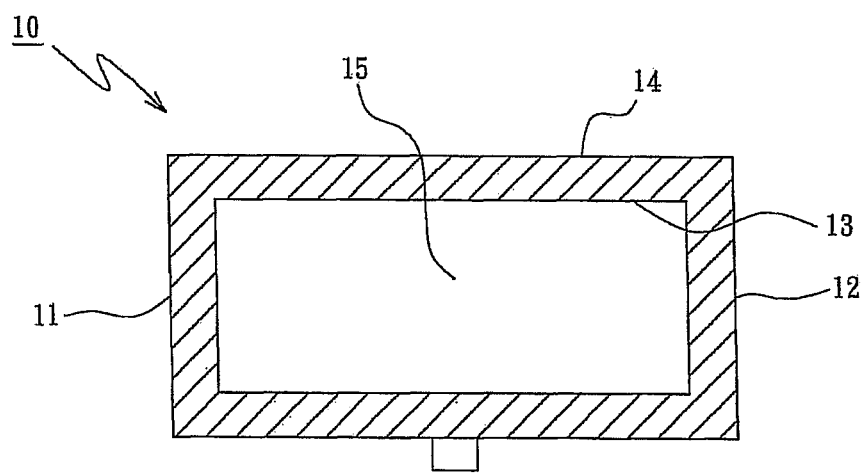
FIG. 4 shows a cut-away view of the super-conductive tube of the present invention, along the line B-B.

Referring to FIG. 3 and FIG. 4, the super-conductive tube 10 of the present invention is a hollow tube and includes a hollow space 15 that is divided by the front end surface 11, the rear end surface 12, the inner tube wall 13 and the outer tube wall 14, wherein an interior of the hollow space 15 forms a vacuum state by a vacuum technology.

It is worth to be mentioned that when the super-conductive tube 10 of the present invention is applied to the discharge device 20, as the resistance of the super-conductive tube 10 is zero, the electric current will flow continuously on the rim of the inner tube wall 13 of the super-conductive tube 10, allowing the super-conductive tube 10 to generate an electromagnetic field through the operation of the electric current. By this electromagnetic field, the effect of power generation can be achieved by the discharge device 20 that is provided with the metallic coil 21. When there is loss of electric current or kinetic energy is insufficient, the discharge device 20 can be driven again to produce electrical energy. Accordingly, the discharge device 20 can be prevented from operating continuously, thereby achieving an effect of saving energy.

It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. A super-conductive tube used for a discharge device formed integrally by a super-conductive material, comprising: a hollow tube formed by a front end surface, a rear end surface, an inner tube wall and an outer tube wall, thereby forming an enclosed hollow space in the super-conductive tube; wherein the inner tube wall and the outer tube wall being formed by extending the front end surface toward the rear end surface and a side of the outer tube wall being extended with a guide portion toward the discharge device, whereby the guide portion is positioned to receive electric current from said discharge device and said guide portion is designed to guide said electric current into the super-conductive tube to form an electromagnetic field around the super-conducting tube.

2. The super-conductive tube used for a discharge device, according to claim 1, wherein the hollow space is in a vacuum state.

3. The super-conductive tube used for a discharge device, according to claim 1, the super-conductive material comprising ceramic.

4. The super-conductive tube used for a discharge device, according to claim 1, the super-conductive material comprising a double-wall Carbon nanotube with magnesium boride.

5. The super-conductive tube used for a discharge device, according to claim 1, the super-conductive material comprising magnesium boride.

* * * * *